(12) United States Patent
Lee

(10) Patent No.: US 6,958,278 B2
(45) Date of Patent: Oct. 25, 2005

(54) SEMICONDUCTOR DEVICES AND METHODS FOR FABRICATING THE SAME

(75) Inventor: Ki-Min Lee, Seoul (KR)

(73) Assignee: DongbuAnam Semiconductor, Inc., Seoul (KR)

( * ) Notice: Subject to any disclaimer, the term of this patent is extended or adjusted under 35 U.S.C. 154(b) by 32 days.

(21) Appl. No.: 10/746,801

(22) Filed: Dec. 26, 2003

(65) Prior Publication Data

US 2004/0140518 A1 Jul. 22, 2004

(30) Foreign Application Priority Data

Dec. 30, 2002 (KR) ............................... 10-2002-0087372

(51) Int. Cl.[7] ............................................. H01L 21/336
(52) U.S. Cl. .................... 438/287; 438/289; 438/981
(58) Field of Search ................................. 438/275–307, 438/981

(56) References Cited

U.S. PATENT DOCUMENTS

| 5,024,960 A | 6/1991 | Haken |
| 5,670,397 A | 9/1997 | Chang et al. |
| 5,770,490 A | 6/1998 | Frenette et al. |
| 6,214,671 B1 | 4/2001 | Sun |
| 2002/0064964 A1 * | 5/2002 | Jang et al. ................. 438/740 |

* cited by examiner

Primary Examiner—H. Jey Tsai
(74) Attorney, Agent, or Firm—Hanley, Flight & Zimmerman, LLC

(57) ABSTRACT

Semiconductor devices having a dual gate and method for fabricating the same are disclosed. A disclosed example method comprises: forming dummy gates in a semiconductor substrate; sequentially forming a lightly doped drain (LDD) region, a spacer and a source/drain; depositing an insulation film above the semiconductor substrate; exposing the dummy gates by planarizing the insulation film; removing the dummy gates; selectively injecting impurities into a region associated with at least one of the removed dummy gates; forming gate oxide films having different thicknesses on the regions associated with the removed dummy gates; depositing a polysilicon layer above the gate oxide films; and then forming polysilicon gates by planarizing the polysilicon layer.

12 Claims, 4 Drawing Sheets

SEMICONDUCTOR DEVICES AND METHODS FOR FABRICATING THE SAME

FIELD OF THE DISCLOSURE

The present disclosure relates generally to semiconductor devices and methods for fabricating the same, and more particularly to semiconductor devices including transistors where gate oxide films are formed at different thicknesses and fabrication methods for forming the gate oxide films of the transistors at different thicknesses.

BACKGROUND

In general, MOS transistors in semiconductor devices have a structure where conductivity between a source corresponding to a negative electrode and a drain corresponding to a positive electrode is controlled by a voltage applied to a gate as a third electrode.

The gate comprises a gate oxide film and a polysilicon gate provided in a device region of a semiconductor substrate. A spacer formed of an insulation film is provided at side walls of the polysilicon gate.

In addition, the source and drain are provided in a junction region of the semiconductor substrate contacting an LDD (lightly doped drain). The source and drain have impurities of the same conductivity as the LDD injected therein at high concentration On the other hand, semiconductor devices whose reliability and performance have been improved by including a dual gate have been recently developed. A variety of techniques for forming the dual gate are described in U.S. Pat. No. 5,024,960, U.S. Pat. No. 5,670,397, U.S. Pat. No. 5,770,490 and U.S. Pat. No. 6,214,671.

DETAILED DESCRIPTION

Figure 1:
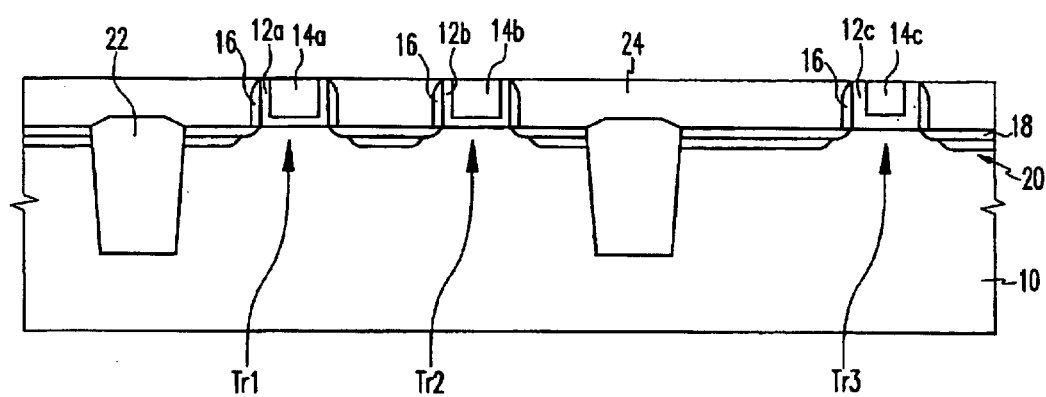
FIG. 1 is a sectional view illustrating an example semiconductor device constructed in accordance with the teachings of the disclosure and having a dual gate.

FIG. 1 is a sectional view of an example semiconductor device having a dual gate. In the illustrated example, gate oxide films 12a, 12b and 12c are formed in the device region of the semiconductor substrate 10 to surround the bottom and sides, but not the top, of the polysilicon gates 14a, 14b and 14c.

In addition, insulating spacers (which may be formed of a material such as TEOS (Tetra Epoxy Silane)) are formed around the gate oxide films 12a, 12b and 12c.

In addition, LDDs 18 are provided in the semiconductor substrate 10 below the gate oxide films 14a, 14b and 14c. The LDDS 18 have impurities with opposite conductivity to that of the semiconductor substrate 10 injected therein at low concentration. The source and drain 20 (which have impurities of the same conductivity as the LDDs 18 injected therein at high concentration) are provided in a junction region of the semiconductor substrate 10 contacting the LDDs 18.

Three transistors Tr1, Tr2 and Tr3 are shown in FIG. 1.

It is noted that the gate oxide film 12c of the transistor Tr3 disposed at the far right of FIG. 1 is formed to be thicker than the gate oxide films 12a and 12b of the remaining transistors Tr1 and Tr2.

The transistor Tr3 with the thicker gate oxide film 12c is a transistor requiring severe reliability and tolerance. The remaining transistors Tr1 and Tr2 (i.e., the transistors with the thinner gate oxide films 12a and 12b) are transistors employed to increase the operation speed of the semiconductor device by using a low threshold voltage.

Further, it is noted that the gate oxide films 12a, 12b and 12c surround all the remaining portions except the top of the gate poly 14a, 14b and 14c. The transistors Tr1, Tr2 and Tr3 having the gate oxide films 12a, 12b and 12c as configured above are advantageous in that the widths of the polysilicon gates 14a, 14b and 14c can be further reduced compared to the prior art.

In addition, although not shown, a PMD (pre-metal dielectric) is formed on the semiconductor substrate 10 on which the transistors Tr1, Tr2 and Tr3 are formed. The PMD has contact holes for partially exposing a region of the polysilicon gates 14a, 14b and 14c and the source and drain 20. A metal wire layer is formed on the PMD. The metal wire layer contacts tungsten plugs provided in the contact holes.

In FIG. 1, reference numeral 22 designates a device isolation region consisting of a STI (shallow trench isolation) or a field oxide film. Also in FIG. 1, reference numeral 24 designates an oxide film functioning as an interlayer insulation film.

An example method for fabricating a semiconductor device such as that shown in FIG. 1 (i.e., a semiconductor device having transistors Tr1, Tr2 and Tr3 as configured above) will now be described.

Figure 2A:
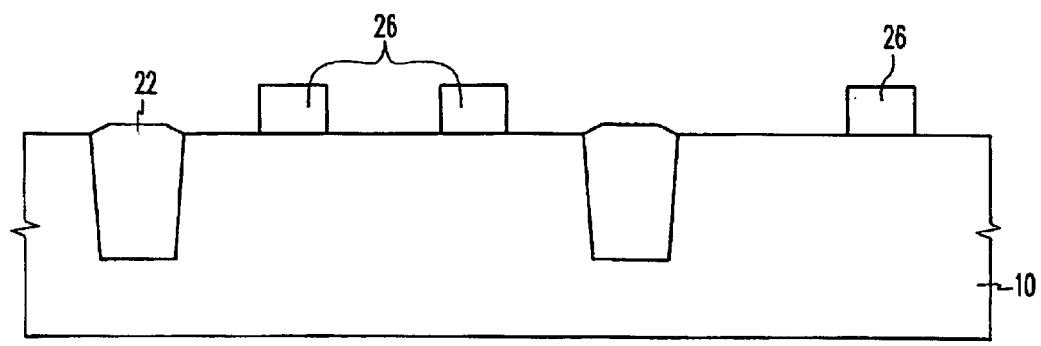
FIGS. 2A to 2F are sectional views illustrating an example process for fabricating the semiconductor device of FIG. 1.

After inorganic material such as silicon nitride (SiN) or organic material such as polyimide is deposited on the semiconductor substrate 10 on which device isolation regions 22 are formed, dummy gates 26 are formed by patterning the deposited material as shown in FIG. 2A. Exposure and development processes using a photoresist can be used for the patterning.

Figure 2B:
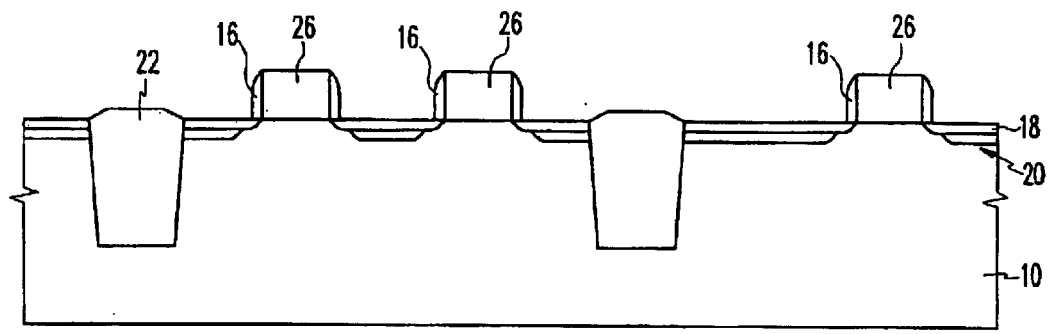

Next, the LDDs 18 are formed as shown in FIG. 2B by injecting impurities of opposite conductivity to that of the semiconductor substrate 10 at low concentration using the dummy gates 26. The spacers 16 are then formed at the side walls of the dummy gates 26. Subsequently, the source and drain 20 are formed by injecting impurities of the same conductivity as the LDDs 18 at high concentration.

Figure 2C:
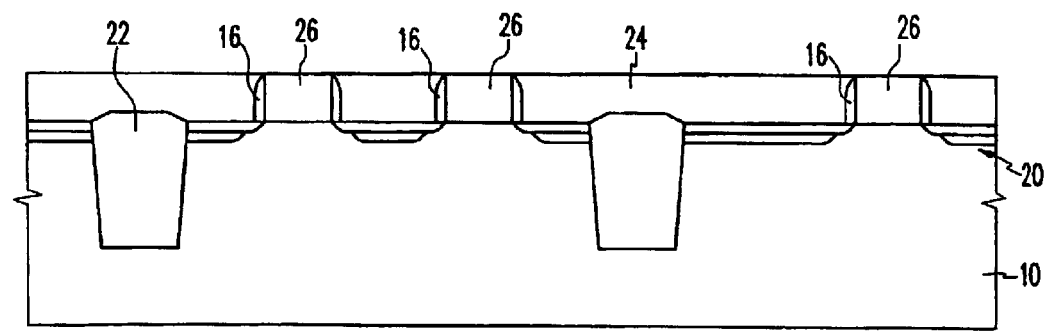

After the source and drain 20 are formed as described above, the oxide film 24 functioning as the interlayer insulation film is deposited as shown in FIG. 2C. The dummy gates 26 are then exposed by planarizing the oxide film 24 using a chemical mechanical polishing (CMP) or etch back method.

Subsequently, the exposed dummy gates 26 are removed. If the dummy gates 26 are composed of silicon nitride, the dummy gates 26 can be removed by a wetted etch method using hot phosphoric acid. If the dummy gates 26 are composed of polyimide, the dummy gates 26 can be removed by using oxygen ($O_2$) plasma ashing.

Figure 2D:
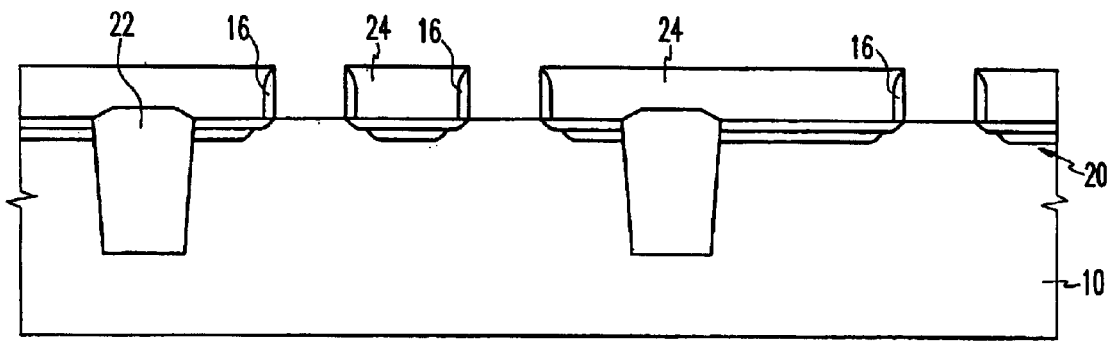

FIG. 2D shows the semiconductor device of FIG. 2C after the dummy gates 26 have been removed.

Figure 2E:
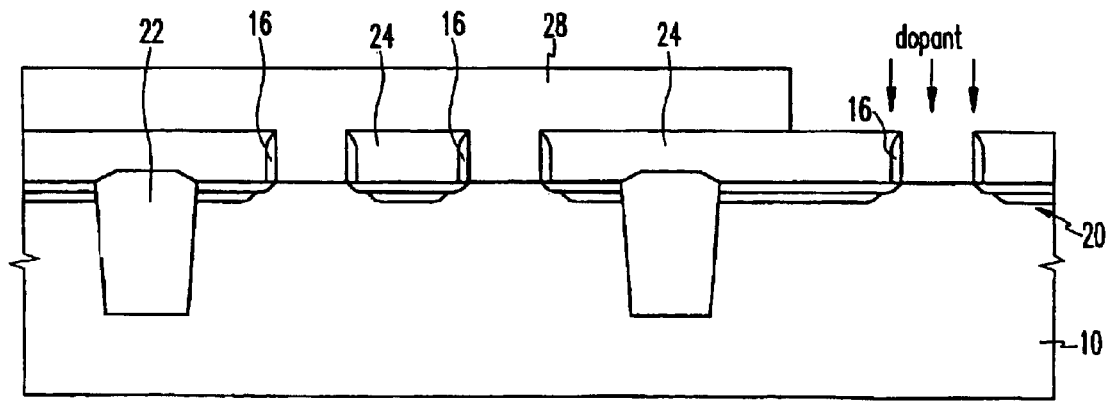

After the dummy gates 26 are removed, a dummy gate region requiring the thick gate oxide film 12c is exposed by patterning a photoresist 28 as shown in FIG. 2E. Dopants such as As, P or Sb are then injected into the exposed dummy gate region as shown n FIG. 2E.

Figure 2F:
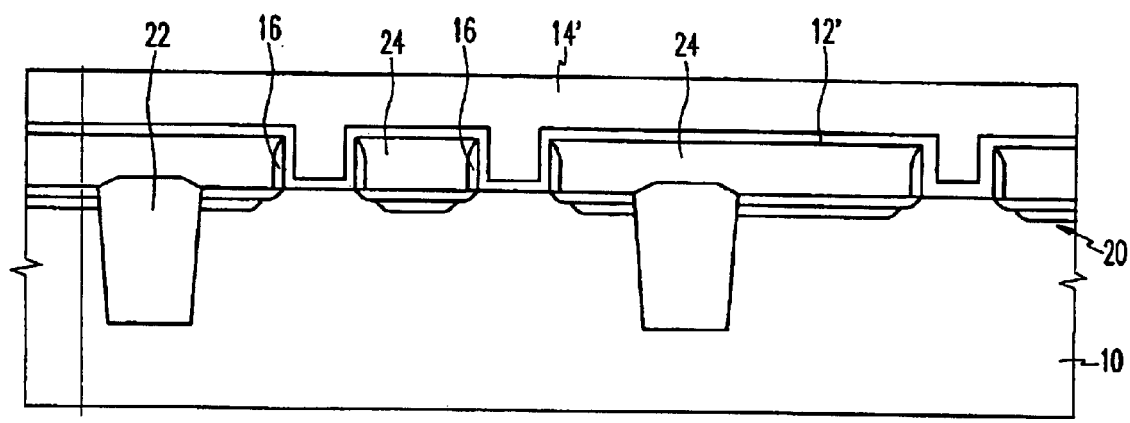

Subsequently, after the photoresist 28 is removed, a gate oxide film 12' and a polysilicon 14' are sequentially deposited as shown in FIG. 2F.

As shown in FIG. 2F, the gate oxide film is deposited thicker on the dummy gate region into which the dopants are injected than on regions other than the dummy gate region into which the dopants are injected. Specifically, when the vacancy concentration in the dummy gate region is increased due to the injection of the dopants, the gate oxide film on the dummy gate region is increased in thickness in proportion to the vacancy concentration.

The polysilicon gates 14a, 14b and 14c are then formed by planarizing the polysilicon layer 14' using a chemical mechanical polishing or etch back method.

Because the gate oxide films 12a, 12b and 12c are formed to have different thicknesses through the process described above, the transistors Tr1, Tr2 and Tr3 have different threshold voltages.

As apparent to persons of ordinary skill in the art from the above description, when transistors having gate oxide films of different thicknesses are simultaneously formed, (e.g., by forming a transistor having a thick gate oxide in a region requiring severe reliability and tolerance, and forming a transistor having a thin gate oxide in a region where operation speed must be increased by using a low threshold voltage), the entire performance and reliability of the semiconductor device can be improved.

From the foregoing, persons of ordinary skill in the art will appreciate that example semiconductor devices having a dual gate have been provided. Such persons will also appreciate that example methods capable of effectively forming a semiconductor having a dual gate have been provided.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for fabricating a semiconductor device, comprising:

forming first and second dummy gates in a semiconductor substrate;

forming a lightly doped drain (LDD), a spacer and a source/drain;

depositing an insulation film above the semiconductor substrate;

exposing the first and second dummy gates by planarizing the insulation film;

removing the first and second dummy gates;

selectively injecting impurities into a region associated with the first dummy gate;

forming a first gate oxide film having a first thickness in the region associated with the first dummy gate and forming a second gate oxide film having a second thickness in a region associated with the second dummy gate, the first thickness being different than the second thickness;

depositing a polysilicon layer above the first and second gate oxide films; and forming first and second polysilicon gates by planarizing the polysilicon layer.

2. A method as defined in claim 1, wherein forming the first and second dummy gates further comprises depositing a film formed of inorganic material such as silicon nitride (SiN) and patterning the deposited film.

3. A method as defined in claim 2, wherein patterning the deposited film comprises exposure and development processes using a photoresist.

4. A method as defined in claim 2, wherein a wet etching process using hot phosphoric acid is used in removing the first and second dummy gates.

5. A method as defined in claim 2, wherein the impurities comprise one selected from a group consisting of As, P and Sb.

6. A method as defined in claim 2, wherein at least one of a chemical mechanical polishing (CMP) method and an etch back method is used to planarize at least one of the insulation film and the polysilicon layer.

7. A method as defined in claim 1, wherein forming the first and second dummy gates further comprises depositing a film formed of organic material and patterning the deposited film.

8. A method as defined in claim 7, wherein the deposited film comprises polyimide.

9. A method as defined in claim 7, wherein patterning the deposited film comprises exposure and development processes using a photoresist.

10. A method as defined in claim 7, wherein removing the first and second dummy gates comprises an oxygen ($O_2$) plasma ashing process.

11. A method as defined in claim 7, wherein the impurities comprises one selected from a group consisting of As, P and Sb.

12. A method as defined in claim 7, wherein at least one of a chemical mechanical polishing (CMP) method and an etch back method is used to planarize at least one of the insulation film and the polysilicon.

* * * * *